(12) United States Patent
Bingham et al.

(10) Patent No.: US 7,378,936 B2
(45) Date of Patent: May 27, 2008

(54) CIRCUIT ELEMENT WITH LASER TRIMMED COMPONENT

(75) Inventors: Devin Bingham, Hillsboro, OR (US);
Daniel J. Ayres, Warren, OR (US);
Alvin Chow, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 314 days.

(21) Appl. No.: 11/135,762

(22) Filed: May 23, 2005

(65) Prior Publication Data
US 2006/0290463 A1  Dec. 28, 2006

(51) Int. Cl.
*H01C 10/00*  (2006.01)
(52) U.S. Cl. ............... 338/195; 338/254; 338/327
(58) Field of Classification Search ........ 338/195–196, 338/254, 260, 327–328
See application file for complete search history.

(56) References Cited

U.S. PATENT DOCUMENTS

| | | | |
|---|---|---|---|
| 4,439,814 A * | 3/1984 | Rhodes ............. | 361/321.5 |
| 4,489,230 A | 12/1984 | Yamamoto | |
| 5,565,818 A | 10/1996 | Robbins et al. | |
| 5,808,272 A | 9/1998 | Sun et al. | |
| 5,965,927 A | 10/1999 | Lee et al. | |
| 6,002,576 A * | 12/1999 | Asakura et al. ........ | 361/311 |
| 6,103,624 A | 8/2000 | Nogami et al. | |
| 6,190,836 B1 | 2/2001 | Grenon et al. | |
| 6,200,405 B1 | 3/2001 | Nakazawa et al. | |
| 6,326,585 B1 | 12/2001 | Aleshin et al. | |
| 6,362,514 B1 | 3/2002 | Ido et al. | |
| 6,576,492 B2 * | 6/2003 | Chen et al. ........... | 438/106 |
| 6,631,558 B2 * | 10/2003 | Burgess .............. | 29/852 |
| 6,873,244 B2 * | 3/2005 | Huang et al. ......... | 338/22 R |
| 7,042,331 B2 * | 5/2006 | Zhou et al. .......... | 338/328 |
| 2002/0060352 A1 | 5/2002 | Mizuno | |
| 2002/0074319 A1 | 6/2002 | Wilbur et al. | |
| 2002/0130757 A1 * | 9/2002 | Huang et al. ........ | 338/22 R |
| 2004/0004534 A1 | 1/2004 | Liao et al. | |

* cited by examiner

*Primary Examiner*—K. Richard Lee
(74) *Attorney, Agent, or Firm*—Bennet K. Langlotz; Thomas F. Lenihan

(57) ABSTRACT

A circuit element has a substrate layer with first and second faces. A conductive first layer overlays the first surface, and a conductive second layer overlays the second surface. The first layer defines a pattern with a trimmable portion. The second layer defines a pattern having a first conductive element registered with at least a portion of the trimmable portion, and a second conductive element electrically isolated from first element and encompassing the first element. The second element may be a ground plane that has an aperture surrounding the first component, which serves as a shield to prevent damage to any elements beyond the second layer.

19 Claims, 1 Drawing Sheet

CIRCUIT ELEMENT WITH LASER TRIMMED COMPONENT

FIELD OF THE INVENTION

The subject invention generally relates to the field of printed circuit elements with laser-trimmed components.

BACKGROUND OF THE INVENTION

Hybrid micro electronic assemblies have employed laser trimmable components such as thin and thick film resistors, capacitors, etc. Such components are applied at a top surface of a substrate, so that a laser (or other means including mechanical means) can make a cut on the trimmable component to change its value. The trimming generally occurs by using the laser to remove part of the material that forms said component. This provides a fine-tuned performance. When the materials to be trimmed are non metallic, lower power is required than when the feature to be trimmed is metallic. If the substrate is ceramic, then damage to surrounding or underlying material is of somewhat less concern.

However, for trim actions performed on an organic-type substrate materials, severing of metallic conductors such as traces formed of copper foil (where greater laser power is required) can damage adjacent or underlying components. Such trimmable components are generally applied to a substrate that is robust enough to avoid damage by the laser beam (e.g. ceramic material). Ceramic substrates provide adequate resistance to damage, but are costly compared to other substrate materials.

Low-cost substrate materials include epoxy resin laminates such as FR-4 and other non-ceramic plastic and resin materials including Kapton,Teflon and other organic based materials. These materials are substantially lower in cost than ceramic materials. However, they are unsuited for severing metallic conductors by laser action for the following reason. A typical FR-4 circuit board having an embedded ground plane can be damaged during the laser trimming of a surface component, because the beam can burn partially into the surface of the board, and penetrate even to the level of lower conductor layers. This burning of the circuit board material generates partially conductive carbon material, which can create a resistive path of uncertain conductivity from the surface component to the ground plane. In other applications, the beam may drill deep enough to damage other embedded (or opposite side) components. Such an effect on sensitive circuits such as a high impedance attenuator, renders the affordable organic materials unsuitable. Accordingly, there is a need for a low-cost methodology to enable the use of laser-trimmable components. The preferred embodiment provides this in the following:

SUMMARY OF THE INVENTION

A circuit element has a substrate layer with first and second faces. A conductive first layer overlays the first surface, and a conductive second layer overlays the second surface. The first layer defines a pattern including a trimmable portion. The second layer defines a pattern having a first conductive element registered with at least a portion of the component, and a second conductive element electrically isolated from first element and encompassing the first element. The second element may be a ground plane that has an aperture surrounding the first component, which serves as a shield to help prevent damage to any elements beyond the second layer.

DETAILED DESCRIPTION OF A PREFERRED EMBODIMENT

Figure 1:
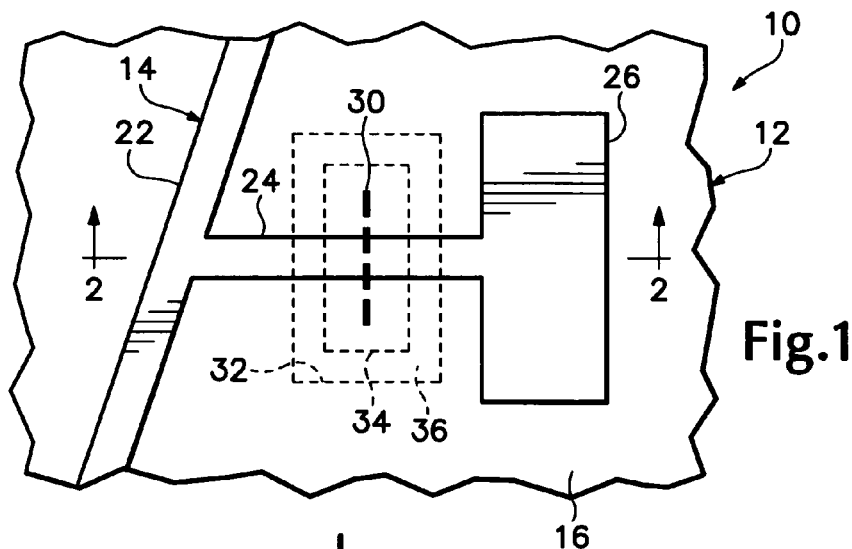
FIG. 1 shows a plan view of a circuit element according to a preferred embodiment of the invention

FIG. 1 shows a circuit element 10. In the preferred embodiment with which the following description proceeds, the circuit is a high impedance attenuator for the probe of a logic analyzer. The circuit has two primary signal capacitors which must have balanced capacitance for optimized performance. The portion of the circuit pertaining to a means for fine-tuning the parasitic capacitance of one of the traces (to provide balanced capacitance with the other) is illustrated in the drawings.

The circuit element 10 is formed on a first substrate layer 12 of FR-4 or other epoxy-resin laminate material, or organic substrates. A first copper foil upper pattern 14 overlays an upper surface 16 of the substrate. A lower surface of the first substrate is directly laminated and underlaid with a second copper foil pattern that includes a ground plane 20 (not shown in FIG. 1) that is coextensive with a large portion of the substrate, and which extends in all directions to the edge (not shown) of the circuit board. In the preferred embodiment, the typical thickness of the first copper foil is roughly 0.002 inch, and the second copper foil is roughly 0.0005 inch.

The upper pattern includes a signal trace 22 extends through the illustrated portion. A spur trace 24 extends laterally from an intermediate portion of the signal trace, and terminates at a block 26 that provides an area of the copper foil to yield an increased capacitance of the signal trace when connected as shown. A cut line 30 is defined across the spur trace, at an intermediate position between the signal trace and the block. The cut line is the location where a laser may be employed to sever the block from the signal trace, in the event the signal trace has excess capacitance compared to what is desired. In the preferred embodiment, several such blocks of different sizes are provided, so that severing different blocks or different permutations of blocks can provide a wide variety of different possible capacitance reductions of the signal line.

The ground plane 20 defines an aperture 32 that is registered with the cut line 30, and within which the entire cut line resides, as viewed in the plan view. The second foil pattern further includes a shield element or island 34 encompassed by the ground plane, and electrically isolated from the ground plane, with which it is coplanar. The island is separated from the ground plane by a gap 36. In the preferred embodiment, the gap is 0.002 inch wide, surrounding an island of 0.003 inch wide by 0.006 inch long. In alternative embodiments, this may vary widely, depending on the dimensions of the anticipated laser trim line length (which in this case is less than 0.006 inch long.)

Figure 2A:
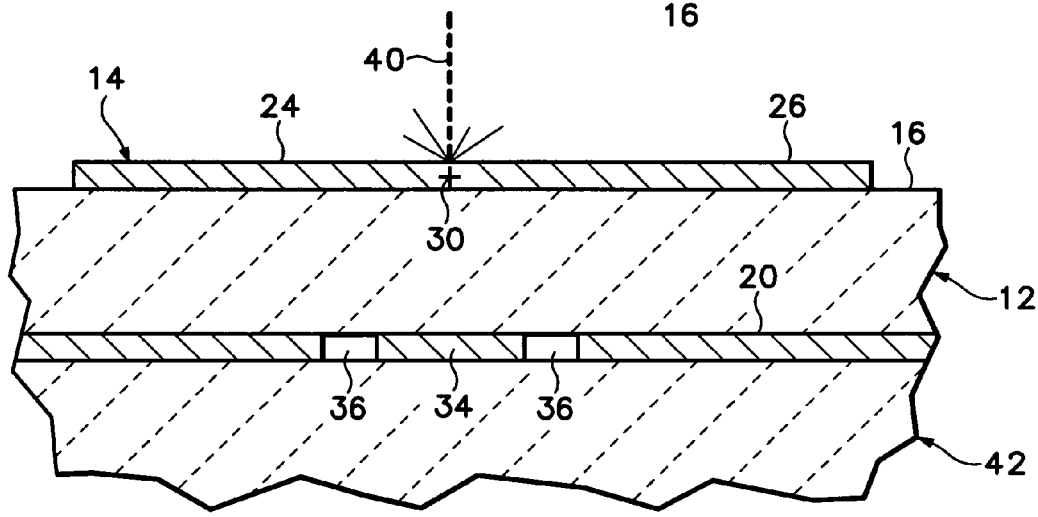
FIG. 2A shows a sectional side view of the embodiment of FIG. 1.

FIG. 2A shows a cross-sectional view, with a laser beam 40 shown as striking the spur trace 24 at the cut line 30. The first substrate layer 12 has a thickness of 0.003 inch, so that the ratio of the thickness to the width of the shield is 1, and the ratio of the thickness to the width of the aperture is 3:7, to ensure against the effect of the beam spreading or misaligning, leading to contact of carbonized substrate material contacting the ground plane. A second substrate 42 is attached below the ground plane, with all the layers being securely laminated together. The second substrate layer may include internal conductive traces and components, either as layers within, or on the far bottom side. The copper foil island 34 provides these components and traces some significant protection from damage by the laser cutting process.

Figure 2B:
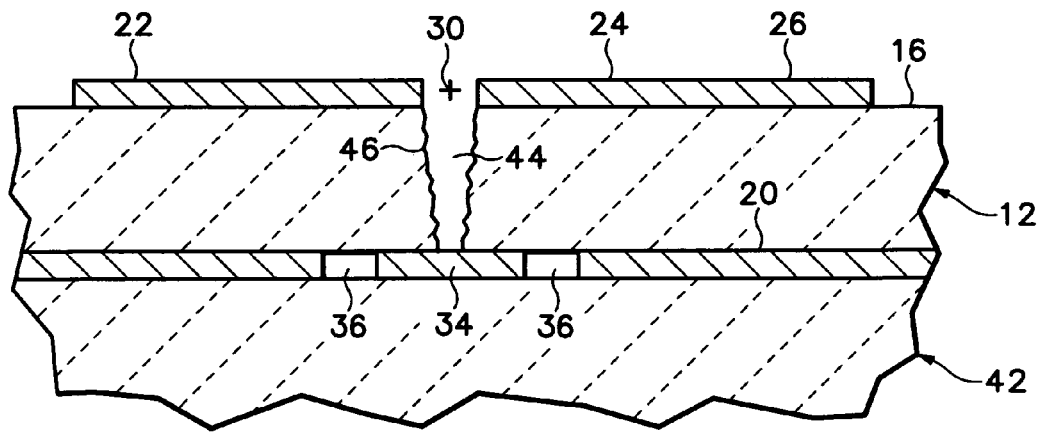
FIG. 2B shows a sectional side view of the embodiment of FIG. 1 after a trimming operation.

FIG. 2B shows the result of the laser cutting process. The spur trace 24 has been severed at the cut line 30, so that the block 26 is now detached from the signal trace 22. For illustration, a cut zone 44 is shown as a trench cut fully through the first substrate 12 to the island 34. Carbonized residue 46 is shown extending from the upper trace 24 to the island, making a potential electrical connection of uncertain resistivity, which necessitates the isolation of the island from the ground plane. In some instances, the laser cut will not extend as deep, and the isolated island will be not be necessary, except as a precaution for other instances.

This disclosure is made in terms or preferred and alternative embodiments, and is not intended to be so limited. For instance, instead of the cut line being employed for severing an electrical connection, it may be employed for trimming a thin or thick film component such as a resistor, in instances in which the trimming risks fully drilling through the substrate. With transparent materials such as Kapton, the use of an isolated shield also provides protection for other components and circuitry beyond the trimmed component, as the beam may otherwise be transmitted with significant energy. For embodiments in which only a single substrate layer is provided, such as a simple double sided circuit board, the island may be omitted, because there is no need to protect other substrate layers or their components. In such an instance, a ground plane with an aperture well clear of the substrate area disturbed at the cut line would be adequate to prevent a resistive connection between the upper trace and the ground plane via the carbonized material.

The invention claimed is:

1. A circuit element comprising:
   a substrate layer having first and second major faces;
   a conductive first layer overlaying the first major face;
   a conductive second layer overlaying the second major face;
   the first layer defining a first pattern having a trimmable portion;
   the second layer defining a second pattern having a first conductive element registered with at least a portion of the trimmable portion; and
   the second layer pattern defining a second conductive element electrically isolated from first element and encompassing the first element.

2. The circuit element of claim 1 wherein the second conductive element extends over a major portion of the substrate.

3. The circuit element of claim 1 wherein the second conductive element is spaced apart from the first element by a gap.

4. The circuit element of claim 1 wherein the first conductive element is entirely surrounded by the second conductive element.

5. The circuit element of claim 1 wherein the trimmable portion defines a trim line, and wherein the second element is positioned laterally beyond the trim line.

6. The circuit element of claim 1 wherein the trimmable portion defines a trim line, and wherein the second element defines an aperture encompassing the trim line.

7. The circuit element of claim 1 wherein the trimmable portion has a plurality of different electrical characteristic alternatives selectable based on a degree of trimming the trimmable portion.

8. The circuit element of claim 1 wherein the substrate is formed of a material that is readily damaged by laser cutting.

9. The circuit element of claim 1 wherein the substrate includes an epoxy resin material.

10. The circuit element of claim 1 wherein the trimmable portion is part of the conductive first layer pattern.

11. A circuit element comprising:
    a substrate layer having first and second major faces;
    a conductive first layer overlaying the first major face;
    a conductive second layer overlaying the second major face;
    the first layer defining a pattern including a conductive path between two pattern elements; and
    the second layer defining a pattern extensive over a substantial portion of the substrate, and defining an aperture registered with a portion of the conductive path.

12. The circuit element of claim 1 wherein the second layer includes a ground plane.

13. The circuit element of claim 1 wherein the second layer includes a second element within the aperture, and spaced apart from the first element by a gap.

14. The circuit element of claim 13 wherein the first element is entirely surrounded by the second element.

15. The circuit element of claim 13 wherein the conductive path defines a cut line, and wherein the second element is positioned laterally beyond the trim line.

16. The circuit element of claim 13 wherein the conductive path defines a cut line, and wherein the aperture encompasses the cut line.

17. The circuit element of claim 13 wherein the substrate is formed of a material that is readily damaged by laser cutting.

18. The circuit element of claim 13 wherein the substrate includes an epoxy resin material.

19. The circuit element of claim 13 wherein the first and second layers are formed of copper foil.

* * * * *